(12) United States Patent
Baker et al.

(10) Patent No.: US 9,487,878 B2
(45) Date of Patent: Nov. 8, 2016

(54) LIGHTING TILES

(71) Applicant: CAMBRIDGE DISPLAY TECHNOLOGY LIMITED, Cambridgeshire (GB)

(72) Inventors: Colin Baker, Cambridge (GB); Aleksandra Rankov, Novi Sad (RS)

(73) Assignee: CAMBRIDGE DISPLAY TECHNOLOGY LIMITED, Cambridgeshire (GB)

( * ) Notice: Subject to any disclaimer, the term of this patent is extended or adjusted under 35 U.S.C. 154(b) by 0 days.

(21) Appl. No.: 14/832,942

(22) Filed: Aug. 21, 2015

(65) Prior Publication Data

US 2015/0361574 A1 Dec. 17, 2015

Related U.S. Application Data

(62) Division of application No. 14/462,438, filed on Aug. 18, 2014, now abandoned.

(30) Foreign Application Priority Data

Aug. 19, 2013 (GB) .................................. 1314793.9

(51) Int. Cl.
*H01L 29/08* (2006.01)
*C25D 7/12* (2006.01)
(Continued)

(52) U.S. Cl.
CPC ................ *C25D 7/126* (2013.01); *C25D 5/02* (2013.01); *C25D 5/34* (2013.01); *C25D 5/54* (2013.01);
(Continued)

(58) Field of Classification Search
CPC . H01L 51/126; H01L 51/5203; H01L 51/56; H01L 51/0021; H01L 2251/5361; H01L 2251/56; C25D 5/02; C25D 5/34; C25D 5/54

See application file for complete search history.

(56) References Cited

U.S. PATENT DOCUMENTS

| 4,539,507 A | 9/1985 | VanSlyke et al. |
| 2004/0263085 A1 | 12/2004 | Chen et al. |

(Continued)

FOREIGN PATENT DOCUMENTS

| EP | 1 737 274 A1 | 12/2006 |
| EP | 1914816 A2 | 4/2008 |

(Continued)

OTHER PUBLICATIONS

Search Report for Application No. GB1314793.9, dated Jan. 24, 2014.

(Continued)

*Primary Examiner* — Shaun Campbell
(74) *Attorney, Agent, or Firm* — Marshall, Gerstein & Fox LLP

(57) ABSTRACT

We describe a lighting tile having a substrate bearing an electrode structure, the electrode structure comprising: a plurality of electrically conductive tracks disposed over said substrate; and an electrical connection region connecting to said plurality of tracks; wherein the height of said tracks tapers away from said connection region to compensate for a reduction in luminance from said lighting tile array from the electrical connection region which arises from a non-uniform voltage drop which appears along the tracks in use. Advantageously the tracks are fabricated by electroplating: then, as the rate of deposition is determined by the voltage drop along a track during plating, the height of the deposited tracks, and therefore their resistance, will match the profile required in operation to compensate for the reduction in luminance which would otherwise occur.

11 Claims, 7 Drawing Sheets

(51) Int. Cl.
  *H01L 51/52* (2006.01)
  *H01L 51/56* (2006.01)
  *C25D 5/02* (2006.01)
  *C25D 5/34* (2006.01)
  *C25D 5/54* (2006.01)
  *H01L 51/00* (2006.01)

(52) U.S. Cl.
  CPC ....... *H01L 51/0021* (2013.01); *H01L 51/5203* (2013.01); *H01L 51/5212* (2013.01); *H01L 51/56* (2013.01); *H01L 2251/5361* (2013.01); *H01L 2251/56* (2013.01)

(56) References Cited

U.S. PATENT DOCUMENTS

| | | | |
|---|---|---|---|
| 2007/0228368 A1 | 10/2007 | Takahashi et al. | |
| 2008/0007566 A1 | 1/2008 | Park et al. | |
| 2012/0132948 A1* | 5/2012 | Nunotani | H01L 33/38 257/99 |
| 2012/0286298 A1 | 11/2012 | Pang et al. | |
| 2012/0319553 A1* | 12/2012 | Silvernail | H01L 51/5203 313/46 |
| 2013/0146932 A1* | 6/2013 | McDaniel, Jr. | H01L 25/0753 257/99 |
| 2014/0197403 A1* | 7/2014 | Hayashi | H05B 33/26 257/40 |
| 2014/0332780 A1* | 11/2014 | Hack | H01L 27/3281 257/40 |

FOREIGN PATENT DOCUMENTS

| | | |
|---|---|---|
| EP | 2560462 A1 | 2/2013 |
| GB | 2 482 110 A | 1/2012 |
| WO | WO-90/13148 A1 | 11/1990 |
| WO | WO-95/06400 A1 | 3/1995 |
| WO | WO-99/48160 A1 | 9/1999 |
| WO | WO-2008/034405 A1 | 3/2008 |
| WO | WO-2012/004552 A1 | 1/2012 |

OTHER PUBLICATIONS

Search Report for Application No. EP 14 27 5168 dated Mar. 19, 2015.

* cited by examiner

LIGHTING TILES

FIELD OF THE INVENTION

This invention relates to lighting tiles and to organic electronic devices, and to methods for fabricating such tiles and devices.

BACKGROUND TO THE INVENTION

As described in our patent application GB2482110, a common approach to boost the conductivity of the anode connection of a large-area organic light-emitting diode (OLED) lighting tile is to use a matrix of electrically conductive tracks. As shown in FIG. 1a, a lighting tile 200 generally has (anode) electrode tracks defining a hexagonal or square grid 102, with an electrical busbar 104 surrounding the grid (the opening shown is to facilitate connection with the counter electrode).

FIG. 1b illustrates that within a given area of the tile, the current primarily flows through the anode electrode in a single dominant direction. For example, if the current is supplied from all edges of the tile, the predominant direction of the current is towards the laterally central position of the lighting tile. As the highest voltage drop appears at the edges of the lighting tile where electrical busbars are connected to the tracks, providing more metal at the edges reduces the voltage drop. However this also generally results in a decrease in aperture ratio. Here the aperture ratio may be defined as: (1−the area of the electrodes)/(the total active device area).

In GB2482110, we addressed this problem by providing tracks which subdivide into a plurality of tracks with increasing distance from a busbar, thus increasing the conductivity towards the electrical busbars where greater conductivity is needed. An example of this approach is shown in FIG. 1c. Furthermore, it is desirable to minimise the voltage drop across the tile when being in operation, in particular in large-area devices. As the light-emitting area of the tile increases, the level of voltage drop for a constant electrical resistance becomes more apparent. This voltage drop manifests itself in a luminance drop across the panel.

There remains, however, a general need for improving the luminance profile of a lighting tile while maximising the aperture ratio.

SUMMARY OF THE INVENTION

According to the present invention there is therefore provided a lighting tile having a substrate bearing an electrode structure, the electrode structure comprising: a plurality of electrically conductive tracks disposed over said substrate; and an electrical connection region connecting to said plurality of tracks; wherein the height of said tracks tapers away from said connection region to compensate for reduction in luminance from said lighting tile array from the electrical connection region.

This approach enables the resistance of the tracks to be matched to their need to carry current in operation, thus compensating for the non-uniform voltage drop which appears along the tracks in use, but without increasing track width to reduce resistance, which would reduce aperture ratio. The technique may be applied to an organic light-emitting diode (OLED) lighting tile and to other lighting tile technologies, for example a light-emitting electrochemical cell (LEC). For an OLED device, preferably a top-emitting or bottom emitting device may be used. It will be appreciated that the benefit of the approach is greatest with large-area devices, for example having at least one lateral dimension of greater than 1 cm. The lighting tile need not be flat but may be flexible. In embodiments, the height of said tracks tapers substantially linearly away from the (external) connection region or busbar.

There is a particularly advantageous method of fabricating such a structure. During electroplating the rate of deposition of material depends on the voltage applied during the process (to a thin seed layer). If, during electroplating, the voltage driving the process is applied via the same or a similar connection region or busbar as will be used when the device is in operation, the rate of deposition will be determined by the voltage drop along a track during the plating process. In this way the height of the deposited tracks, and therefore their resistance, will match the profile required in operation to at least partially compensate for the previously described reduction in luminance which would otherwise occur.

According to a related aspect of the invention there is therefore provided a method of manufacturing a lighting tile, in particular of the type described above, the method comprising: providing a substrate bearing a light emitting structure with an electrically conductive seed layer patterned into tracks; connecting ends of said tracks to an electrical power supply; and electroplating a layer of electrode metal onto said tracks using current from said electrical power supply.

After the electroplating the height of said tracks tapers away from the connection region in a manner which compensates for the reduction in luminance from the lighting tile away from the electrical connection region. In practice the taper may not be exactly linear because the resistance of a track will also vary as material is deposited, but nonetheless there is a substantial match to the profile needed to compensate for the luminance reduction which would otherwise arise. After fabrication luminance across said tile may be uniform to better than 95%. Optionally any residual non-uniformity may be compensated by additional variation of the spacing and/or pattern and/or width of the tracks, or equivalently such variation may be employed to relax the tolerance on the track height variation.

The (negative polarity) connection to the track seeds is preferably made via the connection region or busbar which will be used to provide power to the device when in operation, though this is not essential.

In embodiments a thin seed layer is deposited and then patterned to define the track locations, for example by photolithography, and then the tracks are deposited by electroplating on the patterned seed layer. Alternatively the initial seeding of the track locations may be performed by printing the track seeds from solution. A seed layer may be very thin, for example <5 nm (just a few monolayers thick); for example a palladium seed may be used to plate copper; a copper seed to plate nickel.

A connection to a tile may be, for example, along one edge or around a perimeter of the tile. Any track pattern may be employed—for example a regular rectangular or hexagonal grid, or a pattern in which the track spacing increases away from a connection point or edge. Thus the aperture ration may vary across the surface of the tile (it may increase away from a connection region).

The electrode structure generally further comprises a second, substantially continuous electrode layer beneath the tracks, on said substrate, sandwiching the light emitting material. Thus in embodiments an average sheet conductance of said tracks varies with distance from said connection region according to a current density in this second electrode layer.

The above described techniques need not be restricted to lighting tiles, though they are particularly useful in such applications.

Thus in a further related aspect the invention provides a method of fabricating an organic electronic device, the method comprising: providing a substrate bearing at least one organic layer, wherein said organic layer is sandwiched between first and second electrically conductive layers; said first electrically conductive layer comprising a grid of electrically conductive tracks; providing an electrical busbar region for said grid of electrically conductive tracks, wherein said busbar region extends along a lateral edge of said device and wherein said tracks extend across said device from said busbar region of said device; and arranging for the height of said electrically conductive tracks to decrease with increasing length of electrical path across said device from said busbar region, with a rate of decrease of height defined by electroplating said tracks using a process in which a current is applied via said electrical busbar region.

As before, the height of the tracks tapers with a taper defined by electroplating the tracks using a process in which a current is applied via the busbar electrical connection region. This turns a disadvantage of electroplating into an advantage, and facilitates the fabrication of an organic electronic with a high aperture ratio and, in the case of a light-emitting device, with improved luminance.

In embodiments of the tracks are arranged such that the lateral sheet resistance increases away from said electrical connection region, for example by changing their spacing, width or mutual connection pattern. This facilitates the current being transported over a larger area, and the luminance profile in a lighting tile embodiment. Generally speaking, in a lighting tile tracks with a height that tapers away from the connection region may be combined with any other construction in which the sheet resistance varies with distance from the connection region. In one embodiment of the lighting tile, the tracks may generally extend radially from a laterally central position of the lighting tile towards the electrical connection region in a "starburst" pattern, so as to further decrease the sheet conductance with increasing distance from the connection region.

The invention also provides an organic electronic device, the device comprising: a substrate; an organic layer over said substrate, wherein said organic layer is sandwiched between first and second electrically conductive layers; said first electrically conductive layer comprising a grid of electrically conductive tracks; an electrical busbar connected to said grid of electrically conductive tracks, wherein said busbar extends along a lateral edge of said device; wherein said tracks generally extend across said device from the busbar of said device, and wherein the height of said electrically conductive tracks decreases with increasing length across the device of electrical path from said electrical busbar.

In embodiments the height of said electrically conductive tracks decreases substantially linearly. Again, the height of the electrically conductive tracks may decrease with a rate of decline defined by electroplating the tracks using a process in which a current is applied via the electrical busbar. This architecture allows the current to be over a large area in a manner which results in a more uniform luminance profile and, in embodiments, a greater aperture ratio (for example the average aperture ratio of the organic electronic device may be greater than 80%). In embodiments of the organic electronic device the tracks may generally extend radially from a laterally central position of the organic electronic device towards the electrical busbar.

Optionally, where the second electrically conductive layer comprises a substantially continuous electrically conductive layer, this may be sufficiently thick to be reflective, which leads to a further improvement in luminance.

The above described aspects and embodiments of the invention apply to both a top-emission and a bottom-emission device.

BRIEF DESCRIPTION OF THE DRAWINGS

These and other aspects of the invention will now be further described, by way of example only, with reference to the accompanying Figures in which.

DETAILED DESCRIPTION OF PREFERRED EMBODIMENTS

Embodiments of the invention that we will describe may be used with any type of lighting tile, including organic light emitting diode (OLED)-based devices and the related, but simpler, light-emitting electrochemical cell (LEC)-based devices. Embodiments of the invention may be used with both so-called bottom-emitting and top-emitting devices. It is helpful for understanding the invention to briefly outline some features of OLED devices.

Organic Light Emitting Diodes

Organic light emitting diodes (OLEDs) may be coloured (red, green and blue) or white. In this specification references to organic LEDs include organometallic LEDs, and OLEDs fabricated using either polymers or small molecules. Examples of polymer-based OLEDs are described in WO 90/13148, WO 95/06400 and WO 99/48160; examples of so-called small molecule based devices are described in U.S. Pat. No. 4,539,507.

Figure 1A:
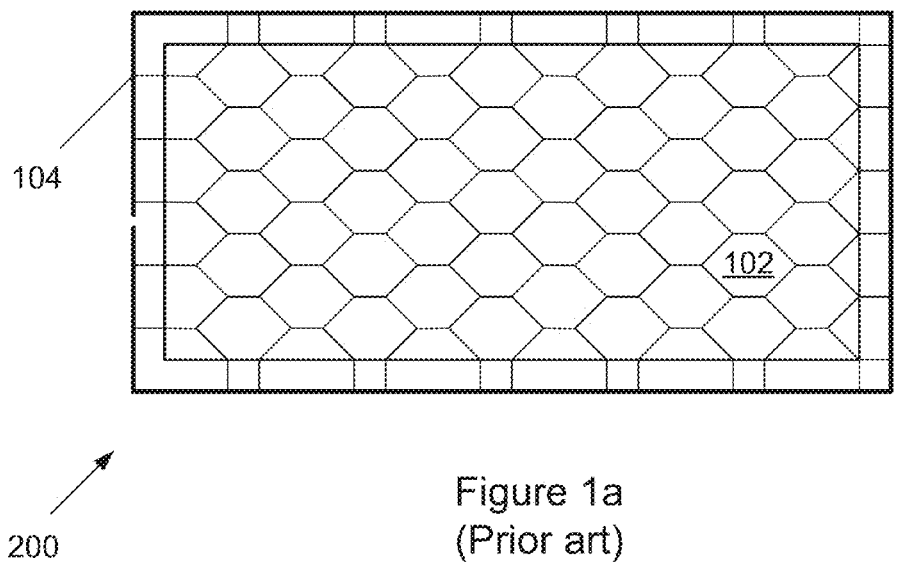
FIGS. 1a to 1d show, respectively, a top-view of a lighting tile exhibiting grids of hexagonal tiled matrices, predominant current flow direction of the lighting tile, a track pattern with varying lateral sheet resistance, and a cross-section through an OLED lighting tile.
Figure 1B:
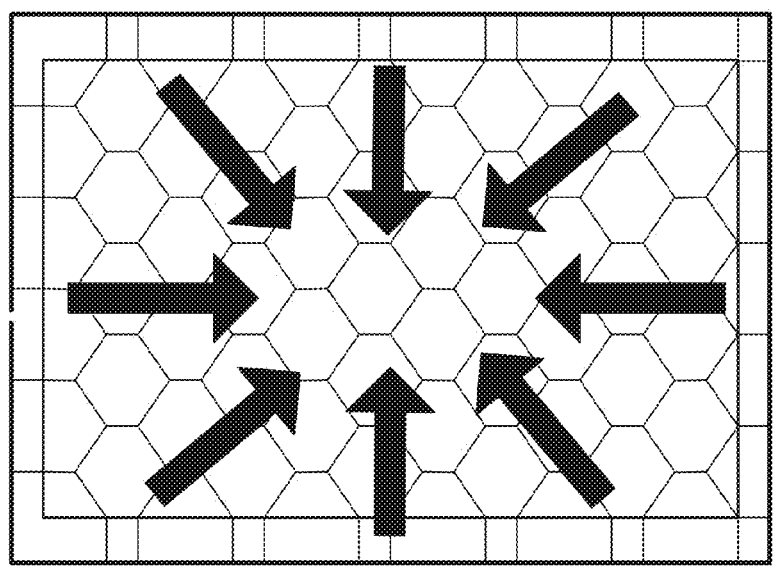
Figure 1C:
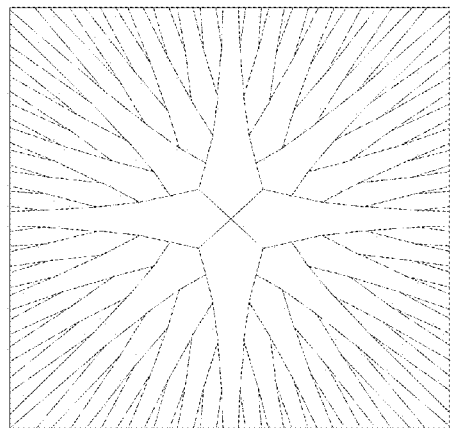
Figure 1D:
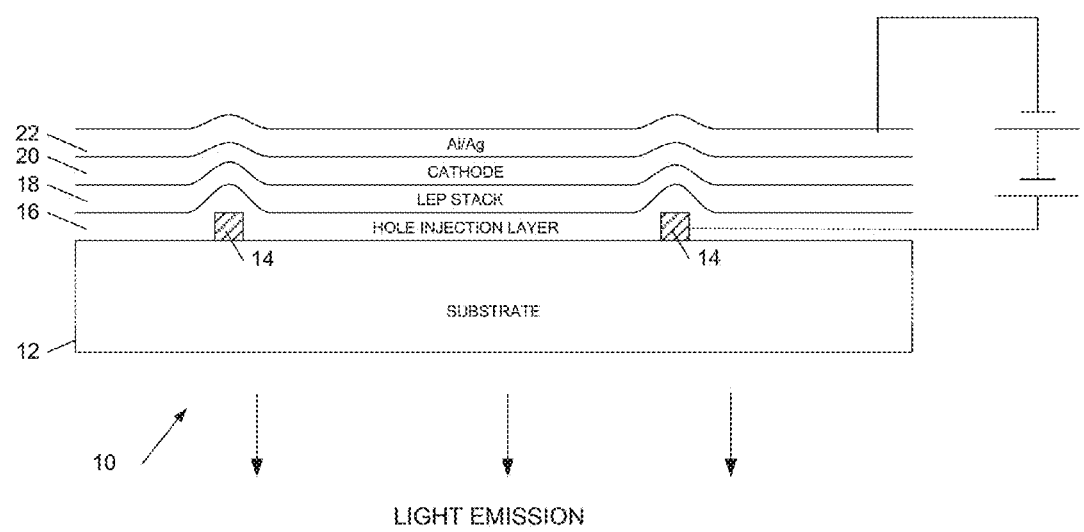

Referring to FIG. 1d, this shows a vertical cross-section through a portion of an OLED lighting tile 10 comprising a glass substrate 12 on which metal, for example copper tracks 14 are deposited to provide a first electrode connection, in the illustrated example an anode connection. A hole injection layer (HIL) 16 is deposited over the anode electrode tracking, for example a conductive transparent polymer such as PEDOT:PSS (polystyrene-sulphonate-doped polyethylene-dioxythiophene). This is followed by a light emitting polymer (LEP) stack 18, for example comprising a PPV (poly(p-phenylenevinylene)-based material: The hole injection layer helps to match the hole energy levels of this layer to the anode metal. This is followed by a cathode layer 20, for example comprising a low work function metal such as sodium, calcium or barium with an optional electron injection layer (not shown), over which is deposited a reflective back (cathode) electrode 22, for example of aluminium and/or silver.

The example of FIG. 1d is a "bottom emitter" device in which light is emitted through the transparent glass or plastic substrate. However a "top emitter" device may also be fabricated in which an upper electrode of the device is substantially transparent, for example fabricated from indium tin oxide (ITO) or a thin layer of cathode metal (say less than 100 µm thickness).

It is generally desirable to reduce the amount of light obscured by the tracking, more precisely to improve the ratio of the voltage drop across a tile to the aperture ratio which is lost to the tracking.

Electrode Profiling

Figure 2A:
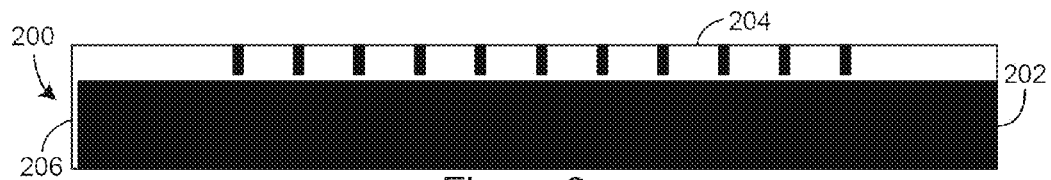
FIGS. 2a-2d show, respectively, cross-sectional views of variants of anode designs on a substrate, and an arrangement for electroplating tracks of a lighting tile according to an embodiment of the invention.
Figure 2B:
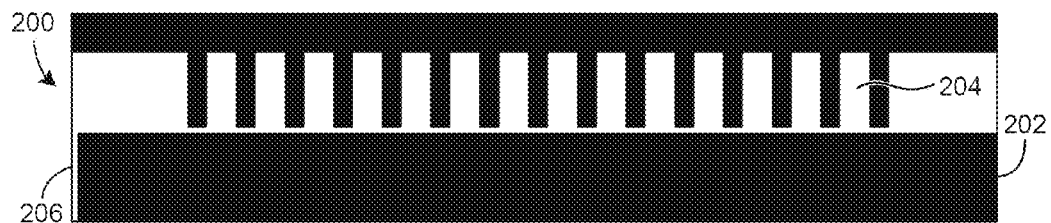

A drawback of the technique outlined in our GB2482110 is that the increased amount of metal tracking used near the edges blocks a larger amount of light, resulting in a decrease in aperture ratio in these areas of the lighting tile and therefore reducing efficiency. An example of such a regular metal grid, applied laterally on a substrate 202, used to achieve a specified luminance and voltage drop across a panel area with aperture ratio AR is shown in FIG. 2a. A preferred approach is shown in the cross-sectional view of FIG. 2b, where the amount of open area is increased by increasing the spacing between the tracks 204. In order to keep the conductivity the same as in FIG. 2a, the height of the tracks 204 is increased. The aperture ratio AR1 of the device in FIG. 2b is therefore greater than AR of the grid shown in FIG. 2a.

Figure 2C:
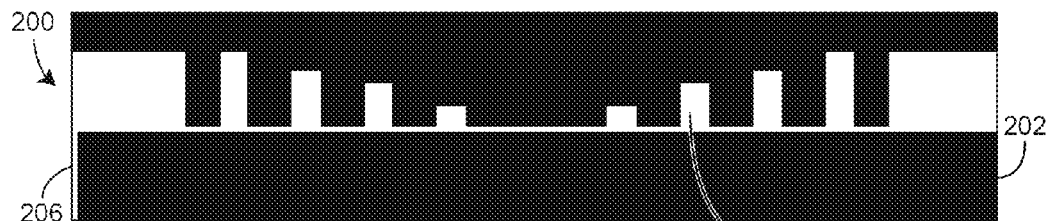

In the present embodiment, we describe a lighting tile 200 in which the aperture ratio can be increased even further while varying the sheet conductance of the tracks 204 laterally in the lighting tile 200. Here, the cross-section of the tracks 204 is varied to achieve an optimum device structure by changing the height of the tracks 204 which tapers away from the connection region (busbar) 206, thus compensating for reduction in luminance from the lighting tile 200 away from the electrical connection region 206. As shown in FIG. 2c, the aperture ratio AR2 is maximised (AR2>AR1>AR) by minimising the amount of metal used, while minimising the voltage drop away from the electrical connection region 206 at the edge of the lighting tile 200 when the device is being operated.

Figure 2D:
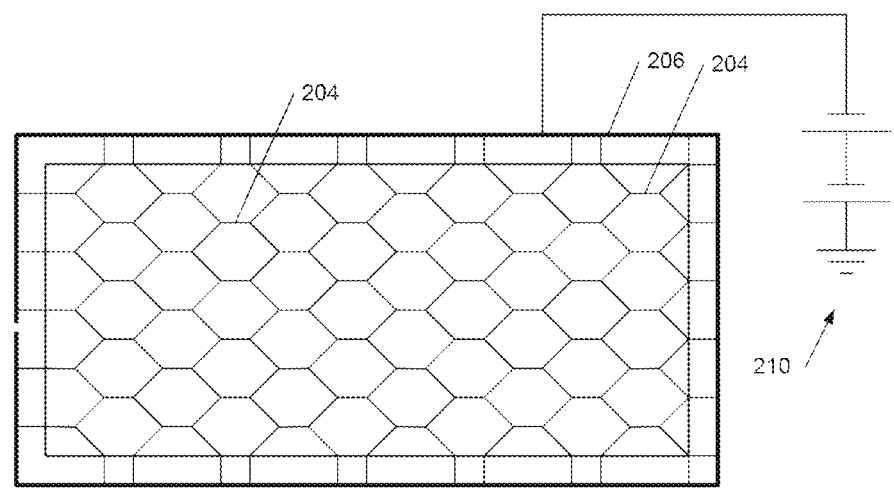

Advantageously the device structure shown in FIG. 2c can be prepared by electroplating, as illustrated in FIG. 2d. A negative power supply 210 is connected to busbar regions 206 around the edge of a tile, attracting the positive metal ions to pre-prepared seed regions (described further below). Preferably several connections are made to busbar region 206 (though only one is shown).

During plating the current density decreases linearly as current flows through the metal seed layer/growing electrode tracks away from the edge of the tile 200 due to the resistance of the tracks 204. The height (h) of metal grown during the electroplating process is proportional to the current density (j): $h \propto j$. As a result, the height tapers away from the connection region 206 as shown in FIG. 2c. This property is what is required for compensating for the reduction in luminance from the lighting tile 200 array from the electrical connection region 206 which would otherwise occur, and results in a net gain in overall luminance for a constant efficiency of the lighting tile 200.

During growth of the metal layer, the resistance changes and is lower where more metal has been deposited. Hence, the decrease in height of the electrically conductive tracks 204 away from the connection region 206 of the lighting tile 200 may deviate slightly from a linear behaviour when using electroplating. Here, the taper is defined by electroplating the tracks 204, where a current is applied via the electrical connection region 206.

The pattern of the metal tracks 204 prepared by electroplating can be obtained by, for example first depositing a seed layer by shadowing, printing from solution or photo-lithographic methods. There is a variety of metals and seed layers which can be exploited using this approach. In this example, palladium is used as a seed layer for growing copper tracks by electroplating. Copper itself may be exploited as a seed layer for nickel. The seed layer may be a few monolayers high, in this example 5 nm.

The aperture ratio can be increased by preparing narrower metal tracks 204. In order to grow high tracks 204, electroplating is particularly useful since comparatively large growth rates can be used. The height of the metal tracks 204 at the connection region 206 of the lighting tile 200 may vary between 50 nm and several µm; the width of the tracks 204 may be between 5 µm and 100 µm (the tracks are still substantially invisible at this width); and the spacing between the tracks 204 may be in the range 500 µm to some 10 s of millimeters. The area of the lighting tile 200 is typically larger than 1 cm$^2$.

The structure obtained will be an optimisation in terms of sheet conductance during operation and allows for preparation of an anode with maximum amount of open area for a minimum voltage drop when operating the lighting tile. The structure may be exploited in a variety of electronic devices, such as, but not limited to organic electronic devices.

We will now describe the resulting luminance uniformity as a function of aperture ratio for given OLED device structures.

Figure 3:
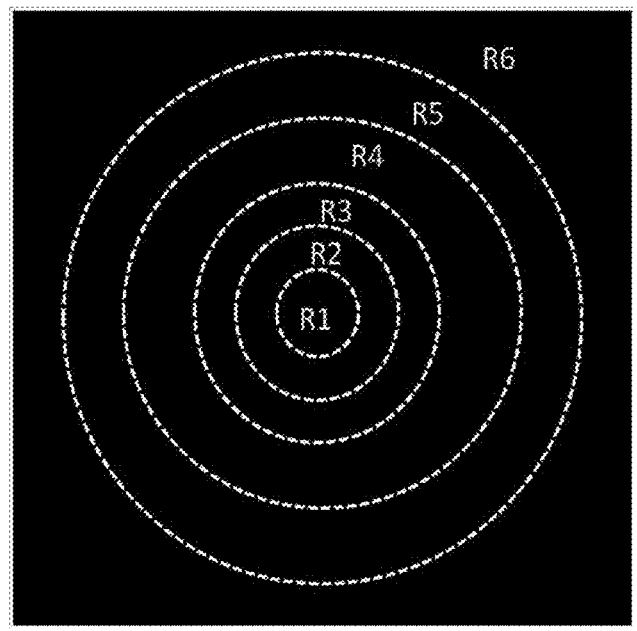
FIG. 3 illustrates a lighting tile with areas of resistance R1-R6.
Figure 4:
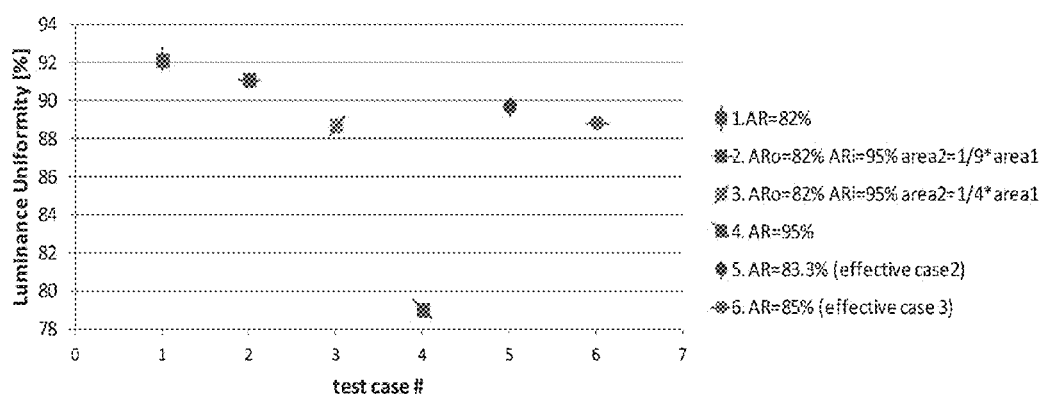
FIG. 4 shows luminance uniformity as a function of aperture ratio.

FIG. 3 shows an example in which the area of an OLED lighting tile is sub-divided into a number of effective areas of constant sheet resistance—here for a regular array of hexagonal grids—, i.e. the resistances of the areas are R1=R2=R3 and so forth. FIG. 4 shows the luminance uniformity of an OLED lighting tile as a function of aperture ratio for a given OLED device structure. It can be seen that for OLED lighting tiles with constant aperture ratios across the entire tile (case 1 and case 4), the luminance uniformity decreases with increasing aperture ratio, and vice versa. Both cases 1 and 4 are not optimal and waste potential open area in the centre of the tile. However, the luminance uniformity over the OLED lighting tile can be improved for a larger effective average aperture ratio if the tile is divided into areas with, for example R1>R2>R3 (reference is made to FIG. 3). Case 2 shows a tile for which 8/9 of the area of the tile has an aperture ratio of 82% and 1/9 of the area has an aperture ratio of 95%. The device of case 2 exhibits a luminance uniformity of approximately 91%, and is higher than the mathematical uniformity of the effective aperture ratio of case 5. This result shows that open area and track width can be relaxed to achieve the same luminance uniformity by dividing the OLED lighting tile into areas with different resistance, while maintaining a large effective aperture ratio.

Figure 5:
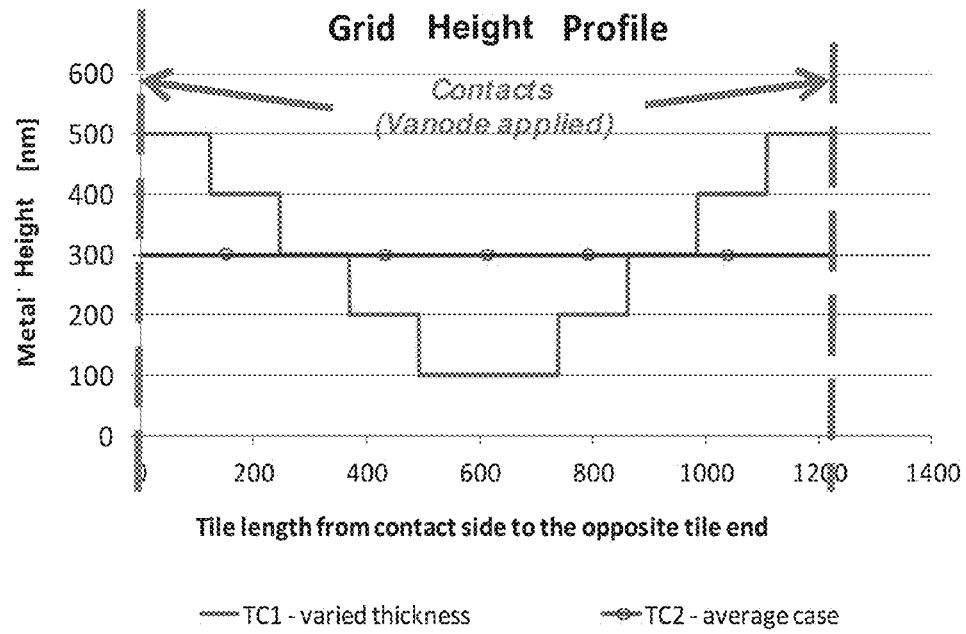
FIG. 5 shows grid height profile for two considered test cases.
Figure 6:
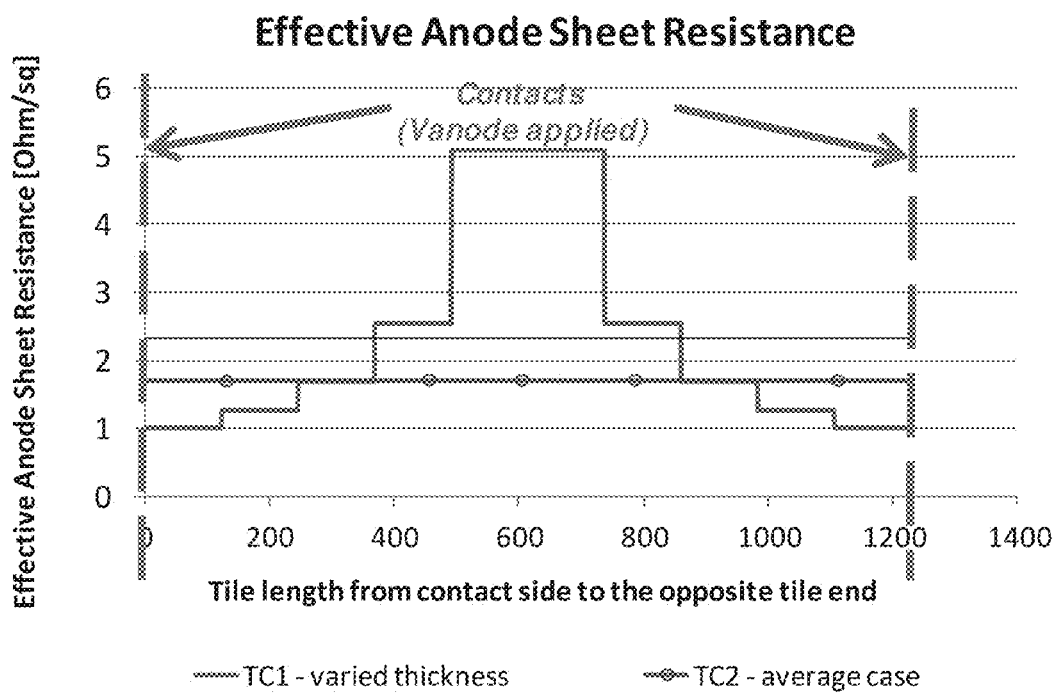
FIG. 6 shows effective anode sheet resistance profile for the two test cases of FIG. 5.

We will now show, by way of modelling, that the average overall luminance increases for a tile in which the anode sheet conductance varies from high at the connection region where the anode is connected to a busbar, to low at the point furthest away from the busbar (FIG. 5, TC1), compared to a device with constant anode sheet conductance over the entire area of the OLED lighting tile (FIG. 5, TC2). The corresponding effective anode sheet conductance profile for the case of TC1 varies in the same linear manner with the grid height which results in the effective anode sheet resistance profile as shown in FIG. 6.

In this model, the two test cases refer to devices with the same aperture ratio of 82%, which allows for a direct comparison of the luminance profile and panel efficiency between TC1 and TC2. The OLED lighting device exhibits a square tile with a hexagonal grid structure. The width of the tracks and the hexagonal cell height are fixed to 50 μm and 530 μm, respectively, corresponding to an aperture ratio of 82%. The metal grid height in TC1 varies in ten equal steps in a linear manner along the tile from 500 nm at the anode contact to 100 nm at the laterally central position of the tile. In TC2, the metal grid height is 300 nm (corresponding to the average height in TC1) and uniform along the entire length of the tile. The lateral area of the tiles in TC1 and TC2 are 1.5 cm×1.5 cm. In both cases, the tile is driven with the same voltage V=4.47 V to achieve a mean luminance of 1000 cd/m2.

It can be seen that the luminance profile is more uniform in TC1 compared to TC2 and the lighting tile appears brighter in TC1. The area with a lower luminance in the centre extends over a larger portion of the tile in TC2 compared to TC1.

Figure 7A:
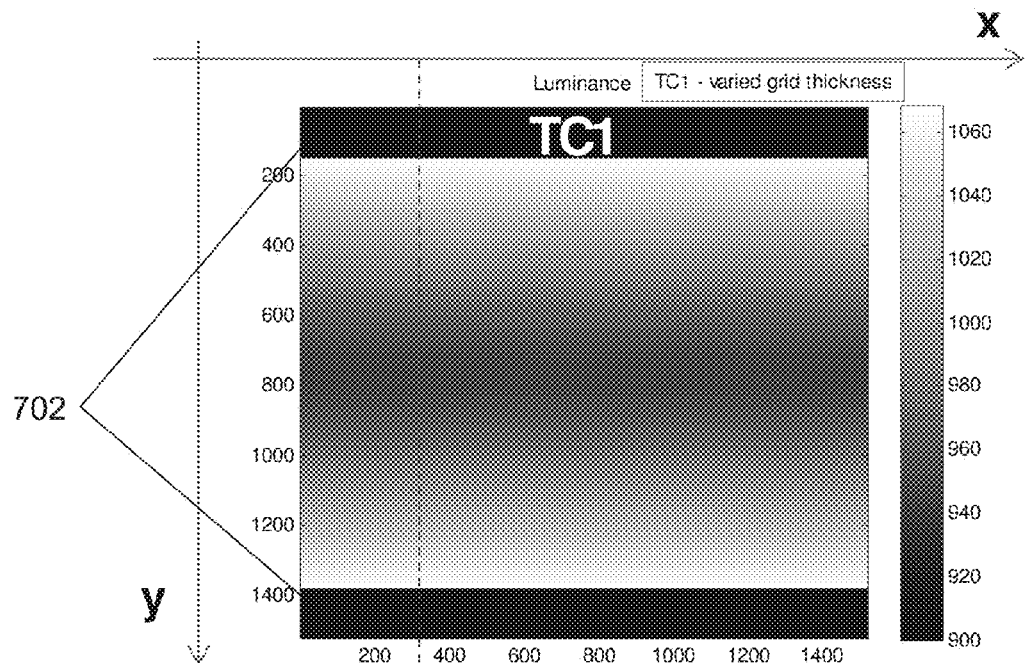
FIGS. 7a and 7b show, respectively, luminance appearances across the lighting tile in the two test cases.
Figure 7B:
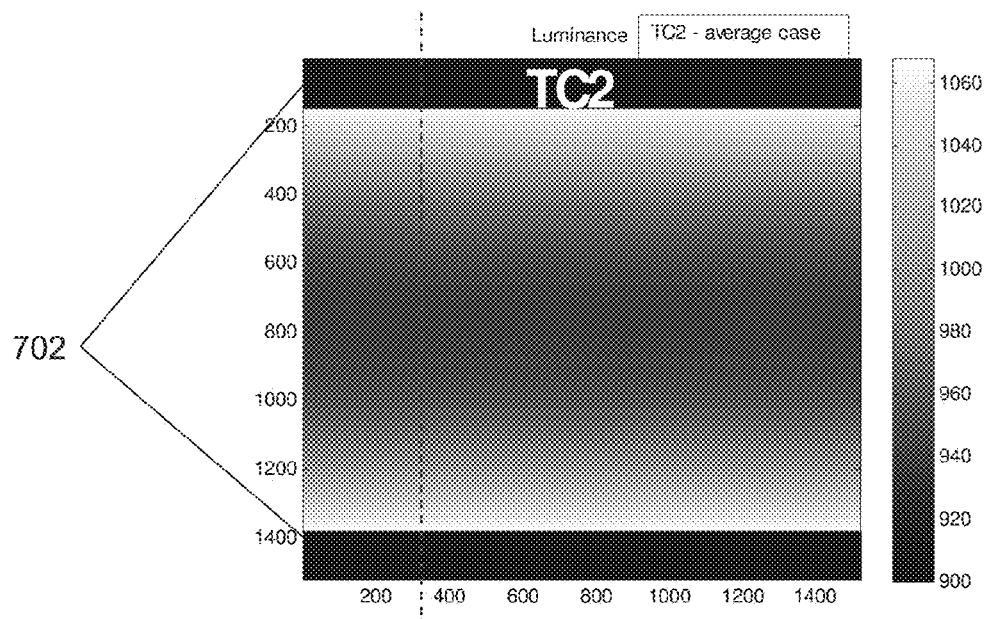
Figure 8:
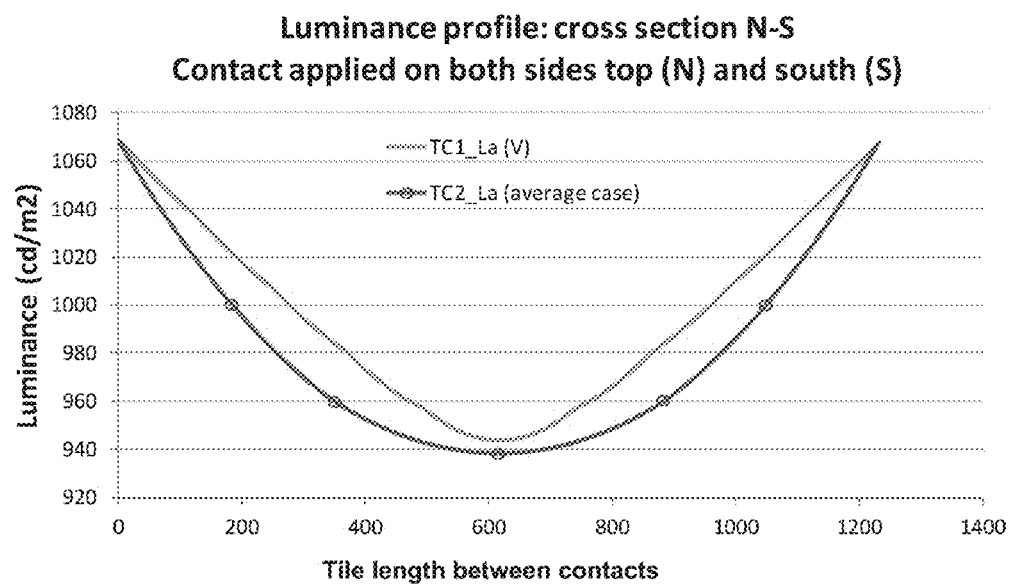
FIG. 8 shows lighting tile luminance x-cross-section profile for the two test cases.

FIG. 8 shows the x-cross section luminance profile for the two test cases as indicated by the dashed lines in FIGS. 7a and 7b. As the overall luminance is proportional to the current flowing through the anode, and the current through the anode is larger if the grid height is varied as described above, the overall luminance is larger for TC1 compared to TC2 for the same aperture ratio (82%) and efficiency (0.99) of the OLED device. The non-uniformity figures calculated are dL/Lmax(TC1)=11.6% and dL/Lmax(TC2)=12.1%. This is only a small improvement of TC1, and the mean luminance in TC1, Lmean(TC1)=997 cd/m$^2$ is only slightly higher than in TC2, Lmean(TC2)=980 cd/m2. However, TC1 is the more optimal case as the rate of change in luminance is more monotonic and at each point along the tile more light will be emitted.

Figure 9:
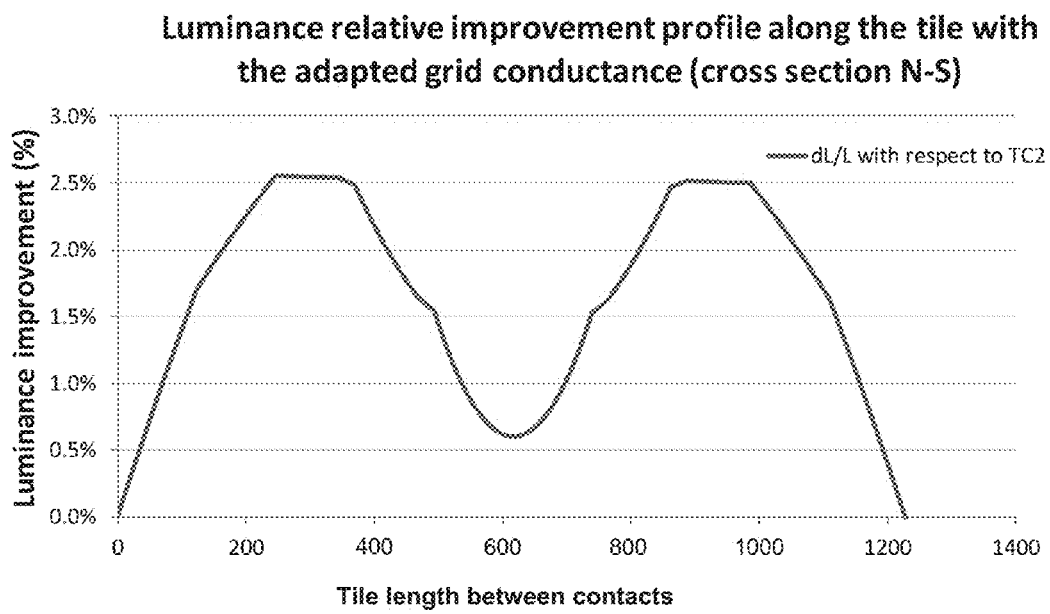
FIG. 9 shows the relative luminance improvement profile along the tile in test case 1 with respect to test case 2.

The relative luminance improvement of TC2 compared to TC1 in the y-direction is shown in FIG. 9. It can be seen that the total integrated luminance is improved when the sheet resistance profile resulting from the varied metal height from the laterally central position of the tile to the connection region is adapted. A summary of performance figures of TC1 and TC2 is provided in Table 1.

TABLE 1

INPUT SETTINGS AND OUTPUT PERFORMANCE FIGURES OF TEST CASES TC1 AND TC2.

| | | inputs | | Simulated | | outputs | |
|---|---|---|---|---|---|---|---|
| Test Case | Grid description | Aspect Ratio (%) | Metal Thickness (nm) | Applied Vanode (V) | material efficacy (lm/W) | Non-Uniformity (dL/Lmax) | Lmean (cd/m2) | Panel Efficiency |
| TC1 | Linear change of metal grid thickness | 82 | Au (500-100-500) in 10 steps | 4.47 | 30 | 11.60% | 997 | 0.99 |
| TC2 | average gill thickness for TC1 | 82 | Au 300 | 4.47 | | 12.10% | 980 | 0.99 |

In this example, the OLED lighting tile exhibits two electrical contacts on two opposite sides of the anode, as well as on two opposite sides of the cathode. The cathode is grounded and a voltage is applied to the anode contacts. The typical case of a busbar around the anode for improvement of the luminance uniformity is not modelled here for sake of simplicity. However, the results obtained are applicable to the more practical case of busbars connected around the entire length of anode and cathode.

The results of the two test cases are shown in FIG. 7. The two black bars 702 in FIGS. 7a and 7b, respectively, represent the anode contacts. It can be seen that the luminance profile does not change along the x-direction in both cases. In the y-direction, however, the luminance varies from approximately 1070 cd/m$^2$ near the anode contacts (which is the same for both test cases since the same voltage V=4.47 V is applied across the OLED device) to approximately 945 cd/m$^2$ and 940 cd/m$^2$ for TC1 and TC2, respectively. The dashed lines in FIGS. 7a and 7b, respectively, show where the x-cross section luminance profile is taken.

It is to be noted that the panel efficiency of 0.99 is the same for TC1 and TC2 because, although the luminance across the tile is higher for TC1, the current consumed by the OLED increases as well. Thus for the same driving conditions (the same voltage V=4.47 V applied to the OLED to achieve the same mean luminance) and the same average conductance, the panel efficiency stays the same.

We have shown that the adapted metal grid sheet resistance and improved luminance performance allows further freedom in grid design geometry to increase the aperture ratio. A further improvement may be achieved once the aperture ratio is maximised with a grid design with optimal metal height and height variation by removal of tracks at equipotential lines which carry no current, as described in GB2482110. Furthermore, the embodiments described herein, with a change of height of the tracks away from the connection region of the tile, may be combined with designs in which a plurality of tracks converge into a single track for increasing distance from the electrical connection region, and/or the spacing between the tracks increases for increasing distance from the electrical connection region, and/or the width of the tracks decreases for increasing distance from the electrical connection region, and/or the tracks mutually connect at a laterally central position. These aspects may be combined with an architecture of the lighting tile in which the tracks generally extend radially from a laterally central position of the lighting tile towards the electrical connection region.

Although we have described an embodiment of the invention in which the fabrication technique we describe is applied to an anode, the skilled person will recognise that for, say, a top-emission OLED device large-area (transparent) cathode may be fabricated in a corresponding manner. No doubt many other effective alternatives will occur to the skilled person. It will be understood that the invention is not limited to the described embodiments and encompasses modifications apparent to those skilled in the art and lying within the scope of the claims appended hereto.

The invention claimed is:

1. A method of manufacturing a lighting tile having a substrate bearing an electrode structure, the method comprising:
    providing a substrate bearing a light emitting structure with an electrically conductive seed layer patterned into tracks;
    connecting ends of said tracks to an electrical power supply; and
    electroplating a layer of electrode metal onto said tracks using current from said electrical power supply, thereby forming an electrode structure comprising a plurality of electrically conductive tracks disposed over said substrate; and an electrical connection region connecting to said plurality of tracks, wherein the height of said tracks tapers away from said connection region to compensate for reduction in luminance from said lighting tile from the electrical connection region.

2. The method of claim 1 wherein the height of said tracks tapers substantially linearly.

3. The method of claim 1 wherein the lighting tile has an aperture ratio of at least 80%.

4. The method of claim 1 wherein the width of a track decreases with increasing distance from said electrical connection region.

5. The method of claim 1 wherein the spacing between said tracks increases with increasing distance from said electrical connection region.

6. The method of claim 1 wherein said electrode structure further comprises a second, substantially continuous electrode layer beneath said tracks, on said substrate, and wherein an average sheet conductance of said tracks varies with distance from said connection region according to a current density in said second electrode layer.

7. The method of claim 1 wherein said tracks define a hexagonal grid with a busbar along one or more edges of the tile.

8. The method of claim 1 wherein said tracks generally extend radially from a laterally central position of said lighting tile towards said electrical connection region.

9. The method as claimed in claim 1 wherein, after said electroplating, the height of said tracks tapers away from said connection region to compensate for reduction in luminance from said lighting tile away from the electrical connection region.

10. A method of fabricating an organic electronic device, the method comprising:
    providing a substrate bearing at least one organic layer, wherein said organic layer is sandwiched between first and second electrically conductive layers; said first electrically conductive layer comprising a grid of electrically conductive tracks;
    providing an electrical busbar region for said grid of electrically conductive tracks, wherein said busbar region extends along a lateral edge of said device and wherein said tracks extend across said device from said busbar region of said device; and
    arranging for the height of said electrically conductive tracks to decrease with increasing length of electrical path across said device from said busbar region, with a rate of decrease of height defined by electroplating said tracks using a process in which a current is applied via said electrical busbar region.

11. The method as claimed in claim 10 wherein the height of said electrically conductive tracks decreases substantially linearly.

* * * * *